(12) United States Patent
Horii

(10) Patent No.: US 7,498,064 B2
(45) Date of Patent: Mar. 3, 2009

(54) LASER REFLOWING OF PHASE CHANGEABLE MEMORY ELEMENT TO CLOSE A VOID THEREIN

(75) Inventor: Hideki Horii, Seoul (KR)

(73) Assignee: Samsung Electronics Co., Ltd. (KR)

( * ) Notice: Subject to any disclaimer, the term of this patent is extended or adjusted under 35 U.S.C. 154(b) by 322 days.

(21) Appl. No.: 11/071,729

(22) Filed: Mar. 3, 2005

(65) Prior Publication Data
US 2006/0024429 A1    Feb. 2, 2006

(30) Foreign Application Priority Data
Aug. 2, 2004  (KR)  .............. 10-2004-0060931

(51) Int. Cl.
*B05D 5/12* (2006.01)
*B05D 3/00* (2006.01)
*H01L 29/04* (2006.01)

(52) U.S. Cl. .............. 427/554; 427/58; 427/97.1; 427/97.7; 257/2; 257/3

(58) Field of Classification Search .............. 427/58, 427/97.1–98.3, 554
See application file for complete search history.

(56) References Cited

U.S. PATENT DOCUMENTS

| 6,576,318 B2 * | 6/2003 | Lee et al. .............. 428/64.1 |
| 6,586,761 B2 * | 7/2003 | Lowrey .............. 257/3 |
| 7,106,622 B2 * | 9/2006 | Nangle .............. 365/163 |
| 2003/0128568 A1 | 7/2003 | Nangle |
| 2004/0241980 A1 * | 12/2004 | Yamazaki et al. .............. 438/632 |

FOREIGN PATENT DOCUMENTS

| JP | 62097325 A * | 5/1987 |
| JP | 4-45583 A | 3/1992 |
| KR | 10-0276565 B1 | 9/2000 |
| KR | 100276565 B1 * | 9/2000 |

* cited by examiner

*Primary Examiner*—William Phillip Fletcher, III
*Assistant Examiner*—Cachet I Sellman
(74) *Attorney, Agent, or Firm*—Myers Bigel Sibley & Sajovec, PA

(57) ABSTRACT

A phase changeable memory element is formed by conformally forming a phase changeable material film in a contact hole on a substrate so as to create a void in the phase changeable material film in the contact hole. The void is at least partially closed by impinging a laser beam on the phase changeable material film sufficiently to reflow the phase changeable material film in the void.

16 Claims, 6 Drawing Sheets

LASER REFLOWING OF PHASE CHANGEABLE MEMORY ELEMENT TO CLOSE A VOID THEREIN

CROSS-REFERENCE TO RELATED APPLICATIONS

This application claims the benefit under 35 U.S.C. § 119 of Korean Patent Application 2004-60931 filed on Aug. 2, 2004, the disclosure of which is hereby incorporated herein by reference in its entirety as if set forth fully herein.

FIELD OF THE INVENTION

The present invention relates to methods of forming semiconductor devices, and more particularly, to methods of forming phase changeable memory elements.

BACKGROUND OF THE INVENTION

Phase changeable memory elements are well known nonvolatile memory elements. A unit cell of a phase changeable memory element includes a data storage element that is formed of a phase changeable material. The phase changeable material has two stable states. That is, the phase changeable material is either in an amorphous state or in a crystalline state in accordance with the temperature of supplied heat and/or the supply time of the heat. The phase changeable material in the amorphous state generally has a higher resistance than that of the phase changeable material in the crystalline state. Therefore, the amount of current that flows through the phase changeable material generally varies with the state of the phase changeable material. It is possible to determine whether the information stored in the phase changeable memory cell is logic "1" or logic "0" using change in the amount of the current. A compound of Ge, Sb, and Te, GST (Ge—Sb—Te), may be used as a well-known phase changeable material. Other phase changeable materials may be used.

Joule heat is used as the heat supplied to the phase changeable material. In particular, current may be supplied to a heating electrode connected to the phase changeable material to generate Joule heat that is to be supplied to the phase changeable material. It is possible to control the temperature of the heat supplied to the phase changeable material by controlling the amount of the supplied current.

A high temperature generally may be needed in order to change the state of the phase changeable material. For example, heat around the melting point of GST of about 630° C. may need to be supplied in order to make the GST amorphous. Therefore, there may be significant increase in the amount of current supplied for a programming or erasing operation. As a result, the power consumption of a phase changeable memory element may be high. Also, the channel width of the MOS transistor in the phase changeable memory element may increase in order to control a large amount of current, so that it may be difficult to highly integrate the phase changeable memory element.

FIGS. 1 and 2 illustrate forming a conventional phase changeable memory element.

Referring to FIG. 1, a lower insulating layer 2 is formed on a semiconductor substrate 1 and a heating electrode 3 is formed on the lower insulating layer 2. An upper insulating layer 4 that covers the heating electrode 3 is formed and the upper insulating layer 4 is patterned to form a contact hole 5 that exposes a predetermined region of the heating electrode 3. A phase changeable material film 6 is formed on the surface of the semiconductor substrate 1 and in the contact hole 5. The phase changeable material film 6 is formed of GST.

As shown in FIG. 2, the phase changeable material film 6 is patterned to form a phase changeable material pattern 6a connected to the heating electrode 3.

According to the above-described conventional phase changeable memory element and the method of forming the same, in order to reduce the amount of current for performing a programming or erasing operation, the width of the contact hole 5 may be reduced. That is, the contact area between the phase changeable material pattern 6a and the heating electrode 3 may be reduced to reduce the amount of current.

However, the aspect ratio of the contact hole 5 generally increases with reduction in the width of the contact hole 5 such that a void 7 may be generated in the contact hole 5. Moreover, since the GST is commonly formed by a sputtering method, the void 7 may be more easily generated. When the phase changeable material pattern 6a is made amorphous (for example, during a programming operation), heat of about 630° C. may be generated at the interface between the phase changeable material pattern 6a and the heating electrode 3. Therefore, Te, whose melting point is about 445° C., may first evaporate from the phase changeable material pattern 6a into the void 7. As a result, the components of the phase changeable material pattern 6a may change (that is, Te is lost). Therefore, the phase changeable material pattern 6a may lose its own characteristics such that the characteristics of the phase changeable memory element may deteriorate.

On the other hand, in order to prevent the void 7 from being generated, after depositing the phase changeable material film 6, the phase changeable material film 6 may be reflowed. A process of reflowing the phase changeable material film 6 may be performed at the temperature around or higher than the melting point of the phase changeable material film 6. A furnace thermal process and/or a rapid thermal process is commonly used as the process of reflowing the phase changeable material film 6.

The rapid thermal process and/or the furnace thermal process may be performed at a temperature no less than about 630° C. for dozens of seconds to several hours. As a result, the void 7 can be filled. However, since the process of reflowing the phase changeable material film 6 is performed for a long time (for dozens of seconds to several hours), Te of the phase changeable material film 6 may evaporate into the void 7 before the void 7 is filled. Therefore, the components of the phase changeable material film 6 in the contact hole 5 may change even after the rapid thermal process and/or the furnace thermal process is performed to reflow the phase changeable material film 6. That is, one part of the phase changeable material film 6 in the contact hole 5 may be heavily concentrated with Te and another part may be lightly concentrated with Te. Also, during the process of reflowing the phase changeable material film 6 in the rapid thermal process and/or the furnace thermal process, Te may evaporate from the top surface of the phase changeable material film 6. Therefore, the components of the phase changeable material film 6 around the top surface may change and the thickness of the phase changeable material film 6 may be reduced. As a result, the characteristics of the phase changeable material pattern 6a may deteriorate such that the characteristics of the phase changeable memory element may deteriorate.

SUMMARY OF THE INVENTION

Phase changeable memory elements may be formed, according to some embodiments of the present invention, by conformally forming a phase changeable material film in a contact hole on a substrate, so as to create a void in the phase changeable material film in the contact hole. The void in the phase changeable material film is at least partially closed by impinging a laser beam on the phase changeable material film sufficiently to reflow the phase changeable material film in the void. The void may be an open void or a closed void. In some embodiments, the void is fully closed. In other embodiments, a laser permeable capping film is formed on the phase changeable material prior to at least partially closing the void, and the laser beam is impinged through the laser permeable film onto the phase changeable material film.

According to other embodiments of the invention, a heating electrode is formed on a substrate and an insulating layer is formed on the substrate, including therein a contact hole that exposes at least a portion of the heating electrode. A phase changeable material film is deposited on the substrate including in the contact hole. Laser thermal treatment is performed using a laser beam to reflow the deposited phase changeable material film. The reflowed phase changeable material film is patterned to form a phase changeable material pattern.

In some embodiments, the laser thermal treatment may be performed by scanning the laser beam emitted through a beam slot onto the phase changeable material film. In some embodiments, in the laser thermal treatment, heat is supplied to the deposited phase changeable material film of a region onto which the laser beam is radiated for about 10 ns to about 1 ms.

According to other embodiments of the present invention, a heating electrode is formed on a substrate and an insulating layer is formed on the substrate, including therein a contact hole that exposes at least a portion of the heating electrode. A phase changeable material film is deposited on the substrate including in the contact hole. A permeable capping film is formed on the deposited phase changeable material film. Laser thermal treatment is performed using a laser beam to reflow the deposited phase changeable material film. The permeable capping film and the reflowed phase changeable material film are patterned to form a phase changeable material pattern and a permeable capping pattern that are laminated. In some embodiments, the permeable capping film is formed outside the contact hole.

In some embodiments, the laser thermal treatment may be performed by scanning the laser beam emitted through a beam slot onto the phase changeable material film. In some embodiments, a closed void may be formed in the contact hole by the deposited phase changeable material film. The closed void is removed by the laser thermal treatment. The permeable capping film may be formed of a material whose transmittance of the laser beam is no less than about 40%. In some embodiments, in the laser thermal treatment, heat is supplied to the deposited phase changeable material film of a region onto which the laser beam is radiated for about 10 ns to about 1 ms.

In other embodiments, a barrier film is formed on the reflowed phase changeable material film and the barrier film and the reflowed phase changeable material film are patterned to form a phase changeable material pattern and a barrier pattern that are laminated.

In some embodiments, the laser thermal treatment may be performed by scanning the laser beam emitted through a beam slot onto the phase changeable material film. In some embodiments, a void whose upper (outer) portion is opened may be formed in the contact hole by the deposited phase changeable material film. The opened void is removed by the laser thermal treatment. In other embodiments, a closed void may be formed in the contact hole by the deposited phase changeable material film. The closed void is removed by the laser thermal treatment. The barrier pattern is formed of a conductive metal nitride in some embodiments. In some embodiments, in the laser thermal treatment, heat is supplied to the deposited phase changeable material film of a region onto which the laser beam is radiated for about 10 ns to about 1 ms.

DETAILED DESCRIPTION OF PREFERRED EMBODIMENTS

Figure 1:
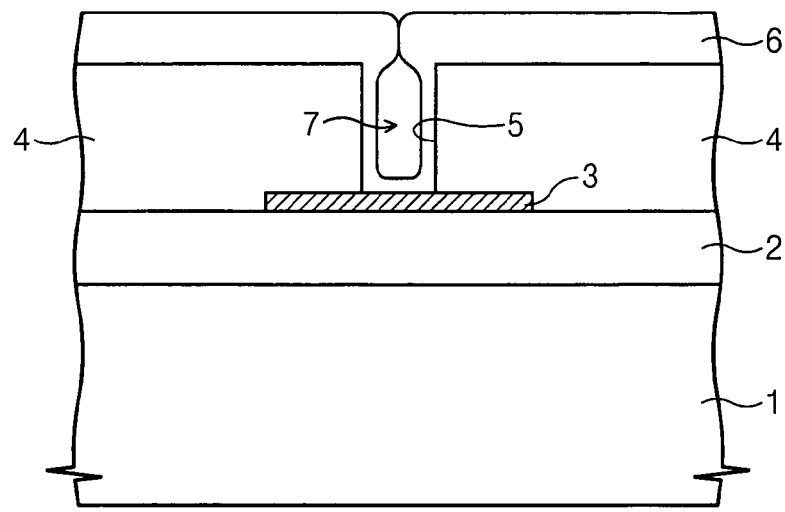
FIGS. 1 and 2 are cross-sectional views illustrating forming a conventional phase changeable memory element.
Figure 2:
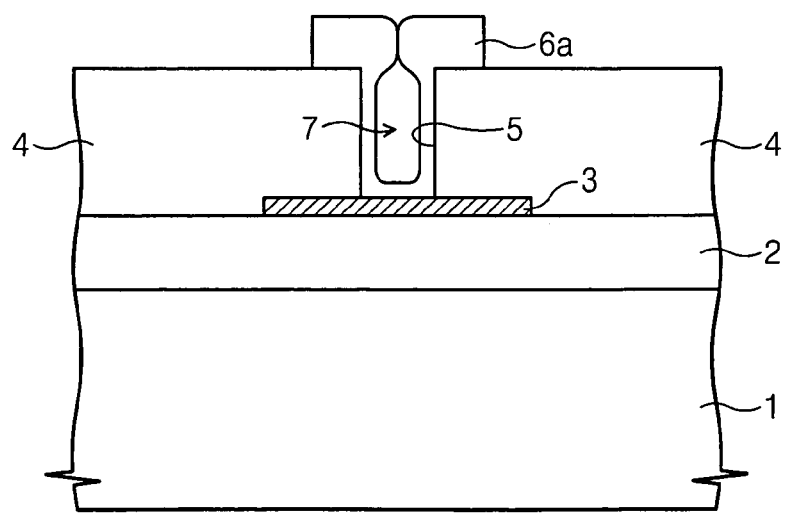

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 3 to 6 are cross-sectional views illustrating methods of forming phase changeable memory elements according to embodiments of the present invention.

Figure 3:
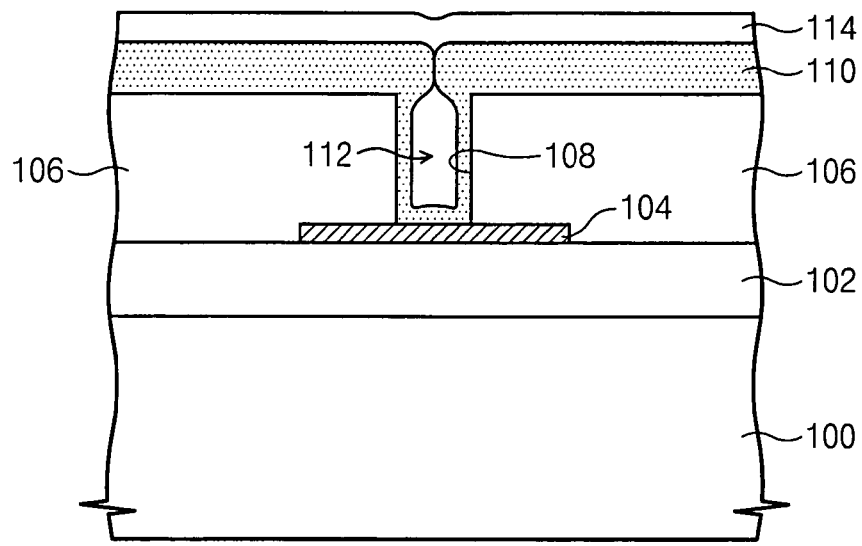
FIGS. 3 to 6 are cross-sectional views illustrating methods of forming phase changeable memory elements according to embodiments of the present invention.

Referring to FIG. 3, a lower interlayer insulating film 102 is formed on a substrate such as a semiconductor substrate 100 (hereinafter, a substrate) and a heating electrode 104 is formed on the lower interlayer insulating film 102. The lower interlayer insulating film 102 may be formed of a silicon oxide film. The heating electrode 104 may be electrically connected to the substrate 100 by a contact plug (not shown) that passes through the lower interlayer insulating film 102 to be connected to the substrate 100. Source/drain regions (not shown) of a MOS transistor may be arranged in the substrate 100 to which the lower contact plug is connected.

The heating electrode 104 may be formed of a conductive material whose reactivity to the phase changeable material is very low. For example, the heating electrode 104 may be formed of a conductive metal nitride. To be specific, the heating electrode 104 may be formed of a single film such as a TiN film, a TaN film, a MoN film, a NbN film, a TiSiN film, a TiAlN film, a TiBN film, a ZrSiN film, a WSiN film, a WBN film, a ZrAlN film, a MoSiN film, a MoAlN film, a TaSiN film, a TaAlN film, a TiON film, a TiAlON film, a WON film, or a TaON film or a composite film of any or all of the above films. The conductive metal nitride may be formed by a physical vapor deposition method, a chemical vapor deposition method, and/or an atomic layer laminating method.

An insulating layer 106 that covers the heating electrode 104 is formed on the surface of the substrate 100. The insulating layer 106 may be formed of a single film such as a silicon oxide film ($SiO_2$), a silicon nitride film ($Si_3N_4$), a silicon oxynitride film, an aluminum oxide film ($Al_2O_3$), an aluminum nitride film (AlN), or a titanium oxide film ($TiO_2$) or a composite film of any or all of the above films. The insulating layer 106 may be formed by the chemical vapor deposition method, the physical vapor deposition method, and/or the atomic layer laminating method. The insulating layer 106 is patterned to form a contact hole 108 that exposes at least a portion of the heating electrode 104.

A phase changeable material film 110 is conformally deposited on the surface of the substrate 100 including in the contact hole 108. The phase changeable material film 110 may be formed of a compound that includes at least one of Te and Se that are chalcogenide elements, and Ge, Sb, Bi, Pb, Sn, Ag, As, S, Si, P, O and/or N. For example, the phase changeable material film 110 may be formed of a material such as Ge—Sb—Te, As—Sb—Te, As—Ge—Sb—Te, Sn—Sb—Te, Ag—In—Sb—Te, In—Sb—Te, 5A-element-Sb—Te, 6A-element-Sb—Te, 5A-element-Sb—Se, and/or 6A-element-Sb—Se. The phase changeable material film 110 may be deposited by a sputtering method that is a physical vapor deposition method. The phase changeable material film 110 may be formed by another deposition method. When the phase changeable material film 110 is deposited, a void 112 may be created in the contact hole 108 due to the aspect ratio of the contact hole 108 and/or for other reasons.

A permeable capping film 114 is formed on the deposited phase changeable material film 110. In some embodiments, the permeable capping film 114 is formed outside the contact hole 108. That is, the permeable capping film 114 is not formed in the contact hole 108 in some embodiments. The upper portion of the void 112 is sealed up by the deposited phase changeable material film 110, so that a closed void is formed. Therefore, the permeable capping film 114 is formed outside the contact hole 108, in particular, over the contact hole 108. The permeable capping film 114 is formed of a material whose transmittance of laser is no less than 40% in some embodiments. For example, the permeable capping film 114 may be formed of a single film such as a silicon oxide film, a silicon nitride film, a titanium oxide film ($TiO_2$), an aluminum oxide film, or an aluminum nitride film that is an insulating film or a titanium nitride film that is a conductive film or a composite film of any or all of the above films.

Figure 4:
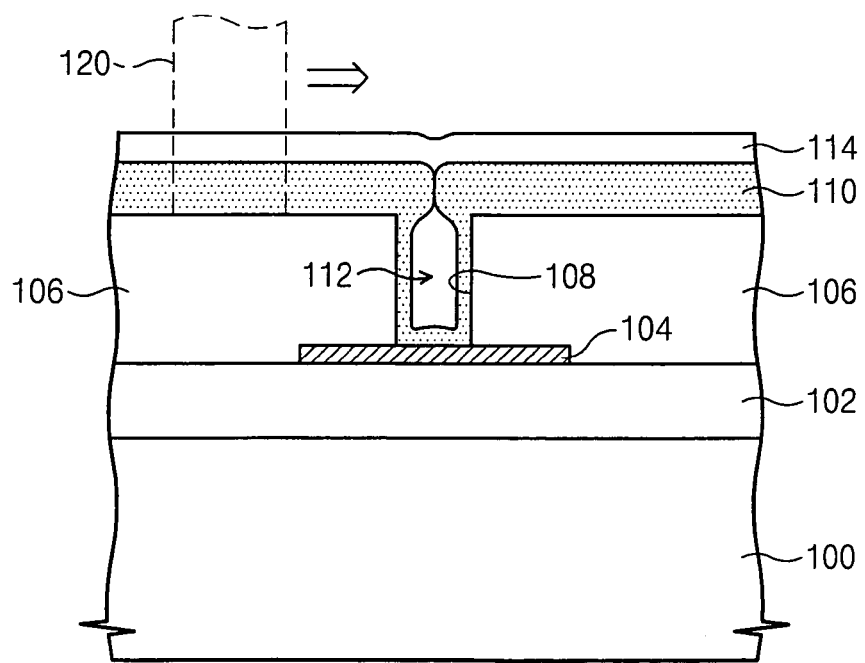
Figure 5:
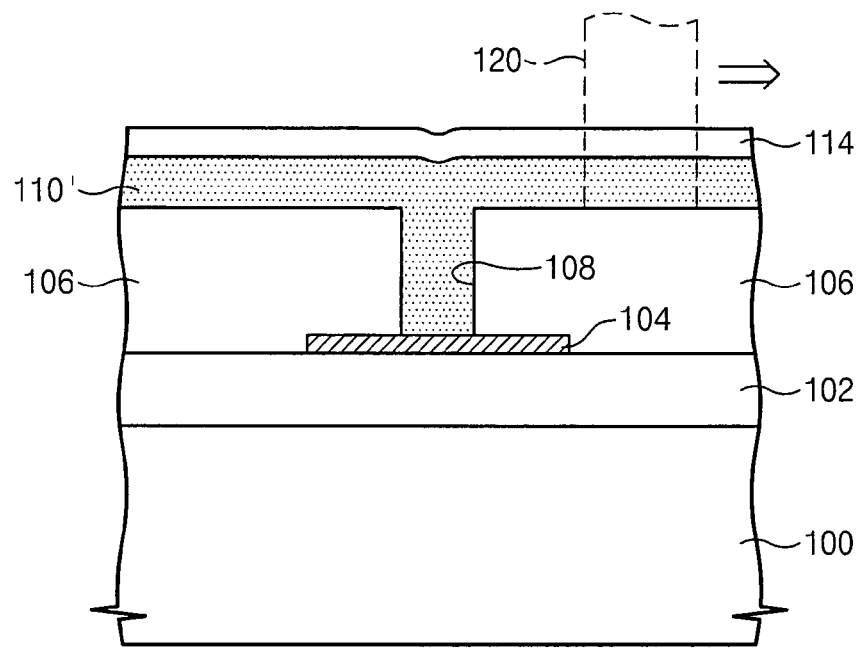

Referring to FIGS. 4 and 5, laser thermal treatment is performed on the substrate 100 using a laser beam 120 to reflow the deposited phase changeable material film 110. Therefore, the void 112 is at least partially filled with the reflowed phase changeable material film 110' such that, in some embodiments, the void 112 is removed. The laser beam 120 may be a gas laser, a semiconductor laser and/or a solid laser. The laser beam 120 passes through the permeable capping film 114 to be radiated onto the deposited phase changeable material film 110.

Accordingly, FIGS. 3-5 illustrate embodiments of the present invention wherein a phase changeable material film 110 is conformally formed in a contact hole 108 on a substrate 100, so as to create a void 112 in the phase changeable material film in the contact hole 108. The void 112 is at least partially closed by impinging a laser beam 120 on phase changeable material film 110 sufficiently to reflow the phase changeable material film in the void. FIG. 5 illustrates embodiments of the invention wherein the void 112 is fully closed.

In some embodiments, the deposited phase changeable material film 110 may be reflowed for a heat supply time that can be much shorter than the heat supply time for which the deposited phase changeable material film 110 is reflowed in the conventional furnace thermal process and/or the rapid thermal process. For example, in some embodiments, the scanning time of the laser beam 120 is controlled such that it is possible to adjust the heat supply time for which heat is supplied to the deposited phase changeable material film 110 from several nanoseconds (ns) to several milliseconds (ms), which is a very short time. It is possible to reflow the deposited phase changeable material film 110 before the components of the deposited phase changeable material film 110 evaporate significantly due to the laser thermal treatment. That is, the deposited phase changeable material film 110 can be almost instantaneously reflowed such that it is possible to reduce or minimize the evaporation of the components of the deposited phase changeable material film 110.

As a result, it is possible to reduce or minimize the change in the components of the reflowed phase changeable material film 110', which may be caused by the evaporation of the deposited phase changeable material film 110 into the void 112. Also, it is possible to reduce or minimize the reduction in the thickness of the reflowed phase changeable material film 110', which may be caused by the evaporation of the components of the deposited phase changeable material film 110 from the top surface of the deposited phase changeable material film 110. Furthermore, it is possible to reduce or minimize the change in the components of the reflowed phase changeable material film 110' in the top surface of the reflowed phase changeable material film 110'. In particular, in some embodiments, the permeable capping film 114 is formed before performing the laser thermal treatment such that it is possible to reduce or prevent the deposited phase changeable material film 110 from evaporating from the top surface of the deposited phase changeable material film 110. Therefore, it is possible to reduce or prevent the characteristics of the conventional phase changeable memory element from deteriorating.

In some embodiments, heat is supplied to the deposited phase changeable material film 110 in a region onto which the laser beam 120 is radiated from about 10 ns to about 1 ms. Therefore, it is possible to reduce the amount of the components that evaporate from the deposited phase changeable material film 110 to no more than about 1% of the entire components and to remove the void 112, in some embodiments.

As a result of depositing GST that is one of phase changeable materials to a thickness of about 100 nm and then, supplying heat of about 700° C. (higher than the melting point of the GST) to the GST for about 1 ms, the thickness of the GST is reduced by about 1 nm. As the temperature of supplied heat increases, the heat supply time for reducing the thickness of the GST by 1 nm may be reduced. Since the viscosity of the GST is reduced to no more than 10 cps (equal to the viscosity of water) at the temperature of 700° C. (higher than the melting point of the GST), it is possible to reflow the GST film even for a short time of 10 ns. Therefore, in order to reduce or minimize the evaporation of the GST film, the laser thermal treatment may be performed for no less than the time (10 ns) for which the GST film can be reflowed. The maximum laser thermal treatment time may be the time (1 ms) where the thickness of the GST film that evaporates is no more than 1 nm. As a result, in a laser thermal treatment according to some embodiments of the invention, the deposited phase changeable material film 110 is reflowed for a heat supply time of about 10 ns to about 1 ms such that the amount of the components that evaporate is reduced to no more than about 1%.

In some embodiments, the laser beam 120 is radiated onto the deposited phase changeable material film 110 by a scanning method. Therefore, it is possible to uniformly supply heat of a predetermined temperature to the deposited phase changeable material film 110 for a very short time. As illustrated in FIGS. 4 and 5, the laser beam 120 can move from one side of the deposited phase changeable material film 110 to the other side of the deposited phase changeable material film 110 at predetermined speed to reflow the deposited phase changeable material film 110.

A scanning method of the laser thermal treatment will be described in more detail with reference to FIG. 7.

Figure 7:
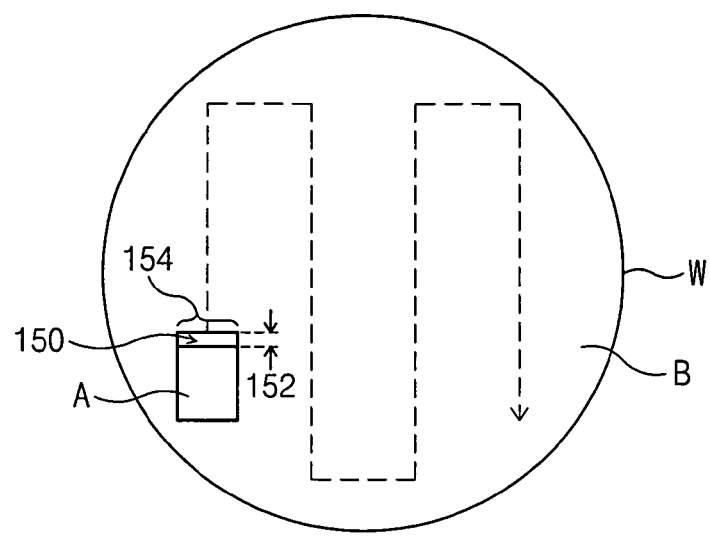
FIG. 7 is a plan view illustrating laser thermal treatment according to exemplary embodiments of the present invention.

FIG. 7 is a plan view illustrating laser thermal treatment according to exemplary embodiments of the present invention.

Referring to FIGS. 4, 5, and 7, the laser beam 120 is emitted onto a wafer W that has the deposited phase changeable material film 110 through a beam slot 150 with a predetermined width 152. For example, the width 152 of the beam slot 150 is 1 μm and the length 154 of the beam slot 150 is 10 mm. The beam slot 150 can scan the wafer W at the speed of 1 mm/s. In FIG. 7, reference numerals A and B denote a reflowed region and a non-reflowed region. In some embodiments, the laser beam 120 scans the entire region of the wafer W as described above such that heat of a predetermined temperature can be uniformly supplied to the deposited phase changeable material film 110 for a very short time (for example, about 10 ns to about 1 ms).

Referring to FIG. 5, the permeable capping film 114 and the reflowed phase changeable material film 110' are patterned to form a phase changeable material pattern 110a and a permeable capping pattern 114a that are laminated. In FIG. 5, the contact hole 108 is filled with the phase changeable material pattern 110a that is connected to the heating electrode 104. The phase changeable material pattern 110a corresponds to the data storage element of a phase changeable memory cell.

Figure 6:
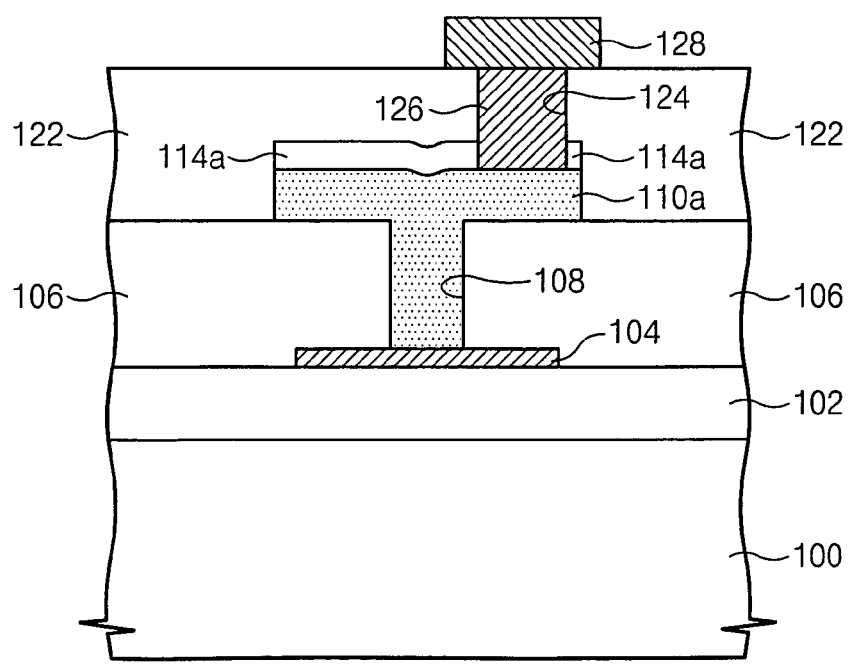

Referring to FIG. 6, an upper interlayer insulating film 122 is formed on the surface of the substrate that has the above patterns 110a and 114a. As illustrated, the top surface of the upper interlayer insulating film 122 may be planarized. When the permeable capping film 114a is formed of an insulating film, the upper interlayer insulating film 122 and the permeable capping pattern 114a may be patterned to form a wiring line contact hole 124 that exposes the phase changeable material pattern 110a. A wiring line plug 126 that fills the wiring line contact hole 124 is formed. The wiring line plug 126 is directly connected to the phase changeable material pattern 110a. In such a case, the width of the wiring line contact hole 124 may be larger than the width of the contact hole 108. That is, the contact area between the heating electrode 104 and the phase changeable material pattern 110a may be smaller than the contact area between the phase changeable material pattern 110a and the wiring line plug 126. Therefore, contact resistance between the heating electrode 104 and the phase changeable material pattern 110a can be larger than contact resistance between the phase changeable material pattern 110a and the wiring line plug 126. As a result, it is possible to supply heat for a programming or erasing operation from the contact surface between the heating electrode 104 and the phase changeable material pattern 110a to the phase changeable material pattern 110a.

In contrast with the above description, when the permeable capping pattern 114a is formed of a conductive film, the wiring line contact hole 124 may pass through only the upper interlayer insulating film 122 to expose the permeable capping pattern 114a. In such a case, the width of the wiring line contact hole 124 can be freely determined regardless of the width of the contact hole 108, in some embodiments. This is because the permeable capping pattern 114a that is formed of the conductive film is electrically connected to the entire top surface of the phase changeable material pattern 110a.

A wiring line 128 that is connected to the wiring line plug 126 is formed on the upper interlayer insulating film 122. The wiring line plug 126 may be a portion of the wiring line 128 that extends to fill the wiring line contact hole 124. The wiring line plug 126 and the wiring line 128 may be formed of a tungsten film, a copper film and/or an aluminum film that is a conductive film.

According to other embodiments, the permeable capping film according to the above-described embodiments is not required. FIGS. 8 to 11 are cross-sectional views illustrating methods of forming phase changeable memory elements according to other embodiments of the present invention. FIG. 12 is a cross-sectional view illustrating a modification of the methods of forming the phase changeable memory elements according to yet other embodiments of the present invention.

Figure 8:
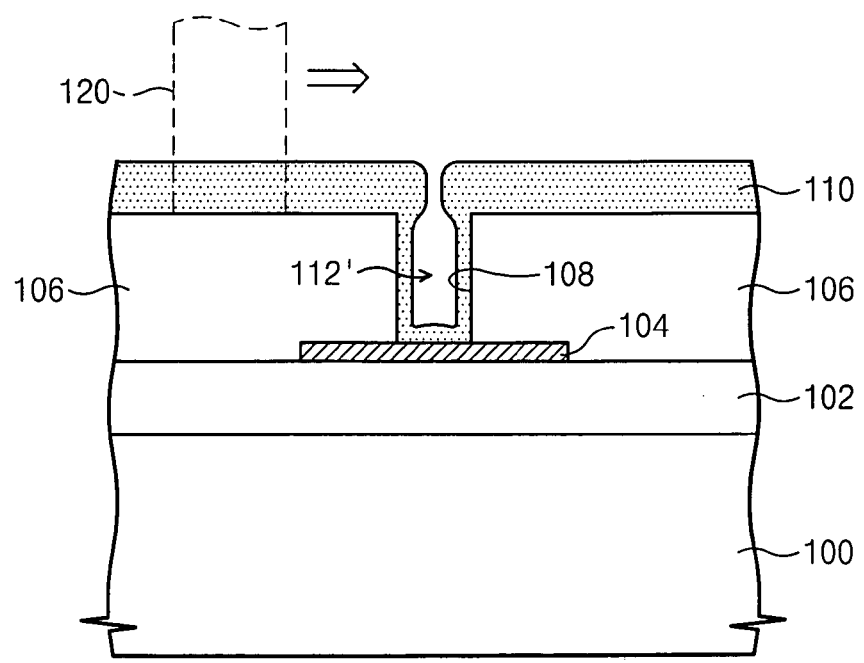
FIGS. 8 to 11 are cross-sectional views illustrating methods of forming phase changeable memory elements according to other embodiments of the present invention.
Figure 9:
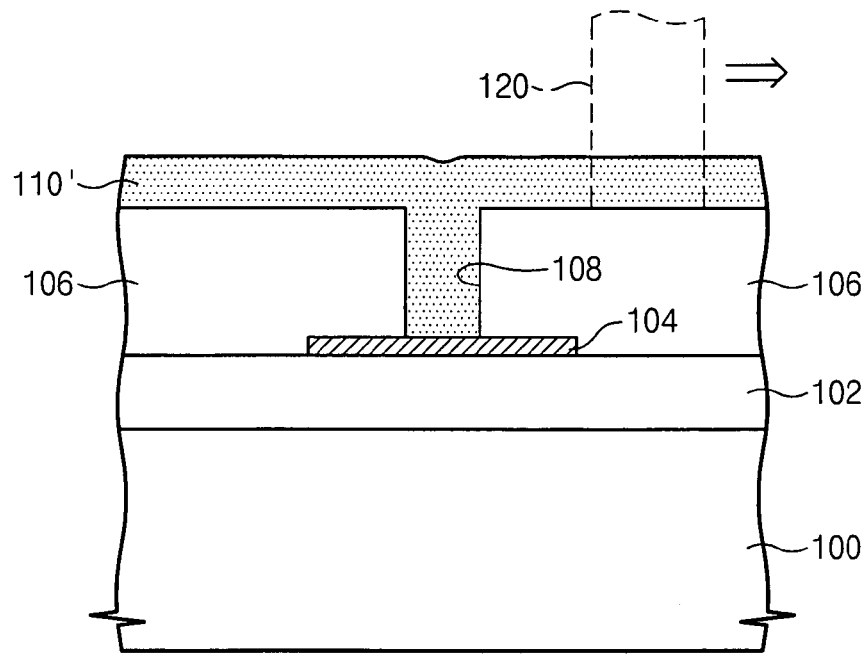

Referring to FIGS. 8 and 9, the contact hole 108 can be formed by the same method according to the above-described embodiments.

A phase changeable material film 110 is deposited on the substrate 100 that has the contact hole 108. A void 112' may be generated in the contact hole 108. In FIG. 8, the upper (outer) portion of the void 112' is opened. An open void 112' is therefore created.

Subsequently, laser thermal treatment is performed on the substrate 100 using the laser beam 120 to reflow the phase changeable material film 110. The opened void 112' is at least partially filled with the reflowed phase changeable material film 110'. The laser thermal treatment may be performed in the same manner as illustrated in the above-described embodiments. That is, according to the laser thermal treatment, the deposited phase changeable material film 110 may be reflowed for a heat supply time much shorter than the thermal supply time for which the deposited phase changeable material film 110 is reflowed in the conventional furnace thermal process and/or rapid thermal process. In particular, according to the laser thermal treatment, heat may be supplied to the deposited phase changeable material film 110 of the region onto which the laser beam 120 is radiated for about 10 ns to about 1 ms. Also, according to the laser thermal treatment, the laser beam emitted through the beam slot 150 of FIG. 7 may be radiated onto the deposited phase changeable material film by the scanning method.

Figure 10:
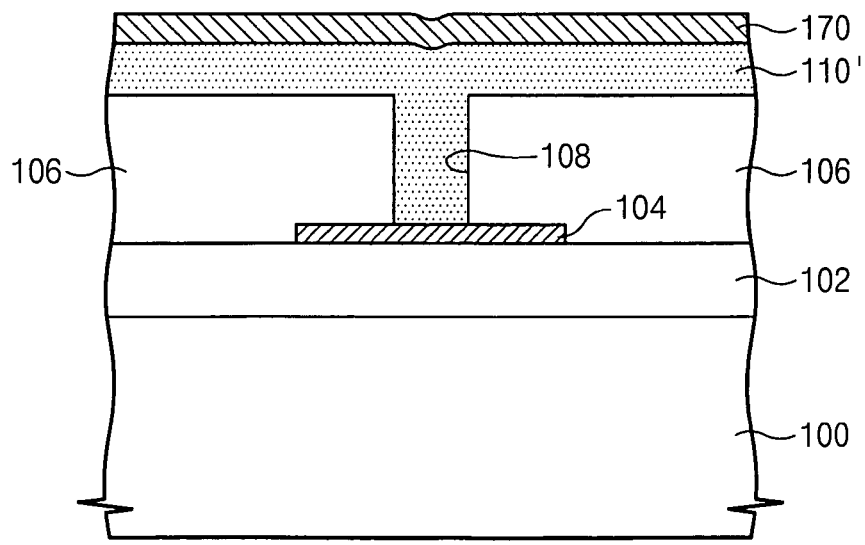

Referring to FIG. 10, a barrier film 170 is formed on the reflowed phase changeable material film 110'. The barrier film 170 may be formed of a material that has low reactivity to the reflowed phase changeable material film 110'. In particular, the barrier film 170 may be formed of a conductive material. For example, the barrier film 170 may be formed of a conductive metal nitride. To be specific, the barrier film 170 may be formed of a single film such as a TiN film, a TaN film, a MoN film, a NbN film, a TiSiN film, a TiAlN film, a TiBN film, a ZrSiN film, a WSiN film, a WBN film, a ZrAlN film, a MoSiN film, a MoAlN film, a TaSiN film, a TaAlN film, a TiON film, a TiAlON film, a WON film, or a TaON film or a composite film of any or all of the above films.

Figure 11:
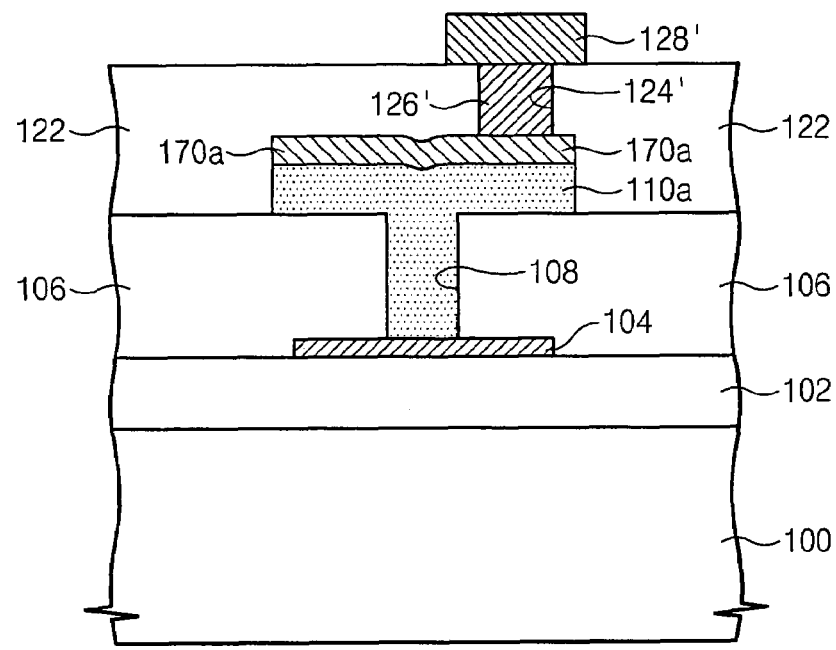
Figure 12:
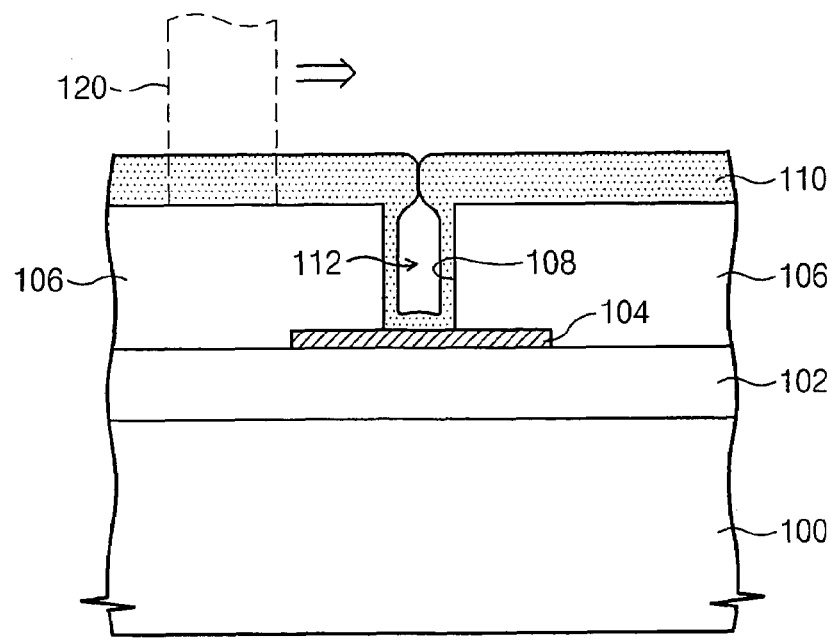
FIG. 12 is a cross-sectional view illustrating yet other methods of forming phase changeable memory elements according to yet other embodiments of the present invention.

Referring to FIG. 11, the barrier film 170 and the reflowed phase changeable material film 110' are patterned to form a phase changeable material pattern 110a and a barrier pattern 170a that are laminated. The phase changeable material pattern 110a corresponds to a data storage element.

An upper interlayer insulating film 122 is formed on the surface of the substrate 100 and the upper interlayer insulating film 122 is patterned to form a wiring line contact hole 124' that exposes the barrier pattern 170a. A wiring line plug 126' that fills the wiring line contact hole 124' is formed and a wiring line 128' that is connected to the wiring line plug 126' is formed on the interlayer insulating film 122. Due to the barrier pattern 170a that is formed of the conductive metal nitride, the width of the wiring line contact hole 124' can be freely determined regardless of the width of the contact hole 108. As a result, it is possible to improve the margin of a process of forming the wiring line contact hole 124'. The wiring line plug 126' and the wiring line 128' may be formed of the tungsten film, the copper film and/or the aluminum film that is the conductive film.

Methods of forming phase changeable memory elements according to embodiments of FIGS. 8-11 may be characterized in that the laser thermal treatment may be performed after depositing the phase changeable material film 110 but prior to forming another film thereon. When a predetermined film (for example, the permeable capping film 114 illustrated in FIG. 3) is formed on the deposited phase changeable material film 110 that has the opened void 112', the predetermined film may also be formed in the contact hole 108. Therefore, although the laser thermal treatment is performed, since the predetermined film as well as the reflowed phase changeable material film 110' may be formed in the contact hole 108, the characteristics of the phase changeable memory element may deteriorate. As a result, according to some embodiments of the invention, the laser thermal treatment is performed immediately after depositing the phase changeable material film 110, prior to forming another film thereon, such that the contact hole 108 can be filled with only the reflowed phase changeable material film 110'. However, in other embodiments, the laser thermal treatment need not be performed prior to forming another film thereon.

Although the closed void 112 illustrated in FIG. 12 is formed in the contact hole 108, the laser thermal treatment may be performed on the deposited phase changeable material film 110 after depositing the phase changeable material film 110 to reflow the deposited phase changeable material film 110 prior to forming another film thereon. However, in other embodiments, the laser thermal treatment may be performed after forming another film thereon.

As described above, according to exemplary embodiments of the present invention, the laser thermal treatment is performed using the laser beam after depositing the phase changeable material film to reflow the phase changeable material film. According to the laser thermal treatment, the deposited phase changeable material film can be reflowed for a heat supply time that can be much shorter than the heat supply time for which the phase changeable material film is reflowed in the conventional furnace thermal process or/and rapid thermal process. Therefore, it is possible to reduce or minimize the evaporation of the components of the phase changeable material film into the void or/and the evaporation of the components of the phase changeable material from the top surface of the phase changeable material film. As a result, it is possible to reduce or minimize the deterioration in the characteristics of the phase changeable material pattern used as the data storage element and to thus reduce or minimize the deterioration in the characteristics of the phase changeable memory element.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of forming a phase changeable memory element, comprising:

forming a heating electrode on a substrate;

forming an insulating layer on the substrate including therein a contact hole that exposes at least a portion of the heating electrode;

depositing a phase changeable material film on the substrate including in the contact hole, the phase changeable material film being configured to transition between a crystalline state and an amorphous state having a higher resistance than the crystalline state responsive to heat applied thereto;

forming a permeable capping film on the deposited phase changeable material film outside the contact hole; and performing laser thermal treatment by impinging a laser beam through the permeable capping film and onto the deposited phase changeable material film for a duration sufficient to reduce a viscosity of the phase changeable material film such that a portion of the phase changeable material film outside the contact hole migrates into the contact hole.

2. The method of forming a phase changeable memory element as set forth in claim 1, wherein the laser thermal treatment is performed by scanning a laser beam emitted through a beam slot onto the phase changeable material film.

3. The method of forming a phase changeable memory element as set forth in claim 1, wherein a closed void is formed in the contact hole by the deposited phase changeable material film and removed by the laser thermal treatment.

4. The method of forming a phase changeable memory element as set forth in claim 1, wherein the permeable capping film comprises a material whose transmittance of the laser beam is no less than about 40%.

5. The method of forming a phase changeable memory element as set forth in claim 1, wherein the phase changeable material film comprises Ge—Sb—Te, and wherein the laser thermal treatment is performed by radiating the laser beam onto a region of the deposited phase changeable material film for a duration of about 10 nanoseconds (ns) to about 1 millisecond (ms).

6. A method of forming a phase changeable memory element comprising:

conformally forming a phase changeable material film configured to transition between a crystalline state and an amorphous state having a higher resistance than the crystalline state responsive to heat applied thereto in a contact hole on a substrate so as to create a void in the phase changeable material film in the contact hole;

forming a permeable capping film on the phase changeable material film; and at least partially closing the void in the phase changeable material film by impinging a laser beam through the permeable capping film and onto the phase changeable material film for a duration sufficient to reduce a viscosity of the phase changeable material film such that a portion of the phase changeable material film outside the void migrates into the void.

7. A method according to claim 6 wherein at least partially closing the void comprises fully closing the void in the phase changeable material film by impinging a laser beam on the phase changeable material film sufficiently to reflow the phase changeable material film in the void.

8. A method according to claim 6, wherein the phase changeable material film comprises Ge—Sb—Te, and wherein the laser beam is impinged on the phase changeable material film in the contact hole for a duration of about 10 nanoseconds (ns) to about 1 millisecond (ms).

9. A method according to claim 6:

wherein at least partially closing the void comprises at least partially closing the void in the phase changeable material film by scanning a laser beam over the phase changeable material film sufficiently to reflow the phase changeable material film in the void.

10. A method according to claim 6 wherein the void is an open void or a closed void.

11. A method according to claim 1, further comprising the following after performing the laser thermal treatment:

patterning the permeable capping film and the phase changeable material film to form a phase changeable material pattern and a permeable capping pattern that are laminated.

12. A method according to claim 6, further comprising the following after at least partially closing the void:

patterning the permeable capping film and the phase changeable material film to form a phase changeable material pattern and a permeable capping pattern that are laminated.

13. A method according to claim 1, wherein the phase changeable material film comprises Ge—Sb—Te. and wherein performing the laser thermal treatment comprises impinging the laser beam for a duration sufficient to reduce the viscosity of the phase changeable material film to about 10 centipoise (cps) or less without substantial evaporation of components thereof.

14. A method according to claim 6, wherein the phase changeable material film comprises Ge—Sb—Te, and wherein at least partially closing the void comprises impinging the laser beam for a duration sufficient to reduce the viscosity of the phase changeable material film to about 10 centipoise (cps) or less without substantial evaporation of components thereof.

15. A method of forming a phase changeable memory element, comprising:

forming a phase changeable material film comprising Ge—Sb—Te on a substrate and in a contact hole therein, the phase changeable material film being configured to transition between a crystalline state and an amorphous state having a higher resistance than the crystalline state responsive to heat applied thereto;

forming a laser permeable capping film on the phase changeable material film outside the contact hole; and impinging a laser beam through the laser permeable capping film and onto the phase changeable material film for a duration sufficient to reduce a viscosity of the phase changeable material film to about 10 centipoise (cps) or less without substantial evaporation of components thereof.

16. A method according to claim 15, wherein impinging the laser beam comprises radiating the laser beam onto a region of the phase changeable material film for a duration of about 10 nanoseconds (ns) to about 1 millisecond (ms).

* * * * *

UNITED STATES PATENT AND TRADEMARK OFFICE
CERTIFICATE OF CORRECTION

| | | |
|---|---|---|
| PATENT NO. | : 7,498,064 B2 | Page 1 of 1 |
| APPLICATION NO. | : 11/071729 | |
| DATED | : March 3, 2009 | |
| INVENTOR(S) | : Horii | |

It is certified that error appears in the above-identified patent and that said Letters Patent is hereby corrected as shown below:

Column 12, Claim 13, Line 22: Please correct "Ge-Sb-Te."
to read -- Ge-Sb-Te, --

Signed and Sealed this

Twenty-eighth Day of April, 2009

JOHN DOLL
*Acting Director of the United States Patent and Trademark Office*